(12) United States Patent
Thirunavukarasu et al.

(10) Patent No.: US 10,549,324 B2
(45) Date of Patent: Feb. 4, 2020

(54) METHOD AND APPARATUS FOR BACKSIDE CLEANING OF SUBSTRATES

(71) Applicant: APPLIED MATERIALS, INC., Santa Clara, CA (US)

(72) Inventors: Sriskantharajah Thirunavukarasu, Singapore (SG); Jen Sern Lew, Singapore (SG); Arvind Sundarrajan, Singapore (SG); Srinivas Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/974,000

(22) Filed: May 8, 2018

(65) Prior Publication Data

US 2018/0257116 A1    Sep. 13, 2018

Related U.S. Application Data

(62) Division of application No. 14/556,085, filed on Nov. 28, 2014, now Pat. No. 9,993,853.

(51) Int. Cl.

| H01L 21/67 | (2006.01) |
| B08B 5/02 | (2006.01) |
| B08B 6/00 | (2006.01) |
| H01L 21/683 | (2006.01) |

(52) U.S. Cl.
CPC .......... B08B 5/02 (2013.01); B08B 6/00 (2013.01); H01L 21/67028 (2013.01); H01L 21/6831 (2013.01); H01L 21/6838 (2013.01)

(58) Field of Classification Search
None
See application file for complete search history.

(56) References Cited

U.S. PATENT DOCUMENTS

| 2009/0183322 | A1 | 7/2009 | Wu et al. |
| 2010/0258144 | A1* | 10/2010 | Broz ............... B24B 37/34 134/6 |
| 2011/0053356 | A1 | 3/2011 | Yang et al. |
| 2013/0263393 | A1* | 10/2013 | Mazumder ........ A47L 13/40 15/1.51 |

OTHER PUBLICATIONS

Douglas W. Cooper, Henry L. Wolfe, James T. C. Yeh, and Robert J. Miller, "Surface Cleaning by Electrostatic Removal of Particles", Aerosol Science and Technology 13:116-123 (1990) Elsevier Science Publishing Co., Inc.

(Continued)

Primary Examiner — Eric W Golightly
(74) Attorney, Agent, or Firm — Moser Taboada; Alan Taboada (57) ABSTRACT

Embodiments of methods and apparatus for removing particles from a surface of a substrate, such as from the backside of the substrate, are provided herein. In some embodiments, an apparatus for removing particles from a surface of a substrate includes: a substrate handler to expose the surface of the substrate; a particle separator to separate particles from the exposed surface of the substrate; a particle transporter to transport the separated particles; and a particle collector to collect the transported particles.

10 Claims, 9 Drawing Sheets

(56) References Cited

OTHER PUBLICATIONS

Viraj Pandit, Emery Kuo, and Cheryl Avery, "Backside wafer particle reduction using ionization in PVD", Solid State Technology, http://electroiq.com/blog/2011/01/backside-wafer-particle-reduction-using-ionization-in-pvd/, Jan. 20, 2011.
Fraunhofer Institute for Interfacial Engineering and Biotechnology, "ElectroClean—Electrostatic surface cleaning", http://www.igb.fraunhofer.de/en/competences/physical-process-technology/electromagnetical-fields/electroclean.html, Fraunhofer IGB (2009).
Ernst Becker, Manuela Reikow-Räuchle and Gerhard Banik, "A New Mass Scale Surface Cleaning Technology for Collections of Historical Maps", Restaurator, vol. 32, p. 160-191, © De Gruyter Saur (2011).
C.I. Calle, P.J. Mackey, M.D. Hogue, M.R. Johansen, H. Yim, P.B. Delaune and, J.S. Clements, "Electrodynamic Dust Shields on the International Space Station: Exposure to the space environment", Journal of Electrostatics 71 (2013) 257-259.
Jong-Ho Kim, Jong-Hyun Kim, Hwa-Su Lee, Hyun-Ha Kim, Atsushi Ogata, "Combination of Electrospray with Electrostatic Precipitator for Collection Efficiency Enhancement of Fine Particles" 2009 Electrostatics Joint Conference, Poster Session P1. 07.
Qcept Technologies, "Product Spotlight > Chemetriq® 5000" http://www.qceptech.com/products5000.htm (2013).
"Semiconductor Manufacturing brought to you by SIMCO", http://technology-ionization.simco-ion.com/MarketSolutions/Semiconductor Manufacturing.aspx#8091425-solutions, (2013).
Nitto Japan, "Cleaning Material for Wafer Chuck Table Cleaning Wafer®", http://www.nitto.com/jp/en/products/groups/semicon/wafer/001/ (2013).

\* cited by examiner

METHOD AND APPARATUS FOR BACKSIDE CLEANING OF SUBSTRATES

CROSS-REFERENCE TO RELATED APPLICATIONS

This application is a divisional of U.S. patent application Ser. No. 14/556,085 filed Nov. 28, 2014, and issued as U.S. Pat. No. 9,993,853 on which is incorporated herein by this reference in its entirety.

FIELD

Embodiments of the present disclosure generally relate to substrate processing equipment, and more particularly, to methods and apparatus for removing particles from the surface of a substrate.

BACKGROUND

The presence of defects caused by particles in microelectronic devices or circuits formed on a substrate negatively impacts product yield. Currently, defect reduction is directed at eliminating the defects caused by particles located at the front side of the substrate, namely, the side where dies are formed. However, the inventors have observed that particles are also often generated at the backside of the substrate because of contact with various system components during chamber processing as well as during substrate handling. For example, the substrate typically rests in a chamber on a pedestal or other substrate support, and over time, particles are generated at the substrate backside as a result of trapped residues and micro-scratches. The inventors have further observed that such particles may be carried with the processed substrates out of the chamber and into other processing locations in a facility. Furthermore, the generated particles may spread to these locations and become an unpredictable source of particles that may negatively impact yield.

Thus, the inventors therefore provide herein improved methods and apparatus for backside cleaning of a substrate.

SUMMARY

In some embodiments, an apparatus for removing particles from a surface of a substrate includes a substrate handler to expose the surface of the substrate; a particle separator to separate particles from the exposed surface of the substrate; a particle transporter to transport the separated particles; and a particle collector to collect the transported particles.

In some embodiments, an apparatus for removing particles from a surface of a substrate includes at least one of a vortex gripper, edge contacts, lift pins, or an edge grip to expose the surface of the substrate; at least one of an ionized gas source located near an edge of the surface of the substrate or an electrostatic induction device that faces the surface of the substrate to separate particles from the exposed surface of the substrate; at least one of a non-ionized gas source located near the edge of the surface of the substrate, a non-ionized gas source facing an opposing surface of the substrate, an electrostatic induction device that faces the surface of the substrate, or a roller fed adhesive film disposed atop the surface of an electrostatic induction device that faces the surface of the substrate to transport the separated particles; and at least one of an electrostatic funnel disposed near an opposing edge of the surface of the substrate or a vacuum source disposed near the opposing edge of the surface of the substrate to collect the transported particles.

In some embodiments, a method of removing particles from a surface of a substrate includes handling the substrate to expose the surface of the substrate, separating particles from the exposed surface of the substrate, transporting the separated particles away from the exposed surface of the substrate, and collecting the transported particles.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods and apparatus for removing particles from a surface of a substrate, such as from the backside of the substrate, are provided herein. The inventive embodiments may advantageously remove the particles without re-contaminating the surface of the substrate. The inventive embodiments may advantageously remove the particles without re-contaminating other areas of the substrate processing equipment. The inventive embodiments may advantageously increase product yield of device or circuit dies formed in the front side of the substrate.

In some embodiments, the substrate may be supported with minimal or no contact with the substrate. Minimizing the surface area of contact advantageously maximizes the exposed areas of the substrate for cleaning as well as minimizes the risk of further contamination or generation of particles due to the contact between the substrate and the substrate support. In some embodiments, while the substrate is held in this manner, particles may be separated from a surface of the substrate, such as from the backside of the substrate (although the frontside could be cleaned as well). The separated particles may then be transported away from the substrate and captured to minimize the risk of recontamination of the substrate or other substrates to be processed. The captured particles may be disposed of in any suitable manner.

Figure 1:
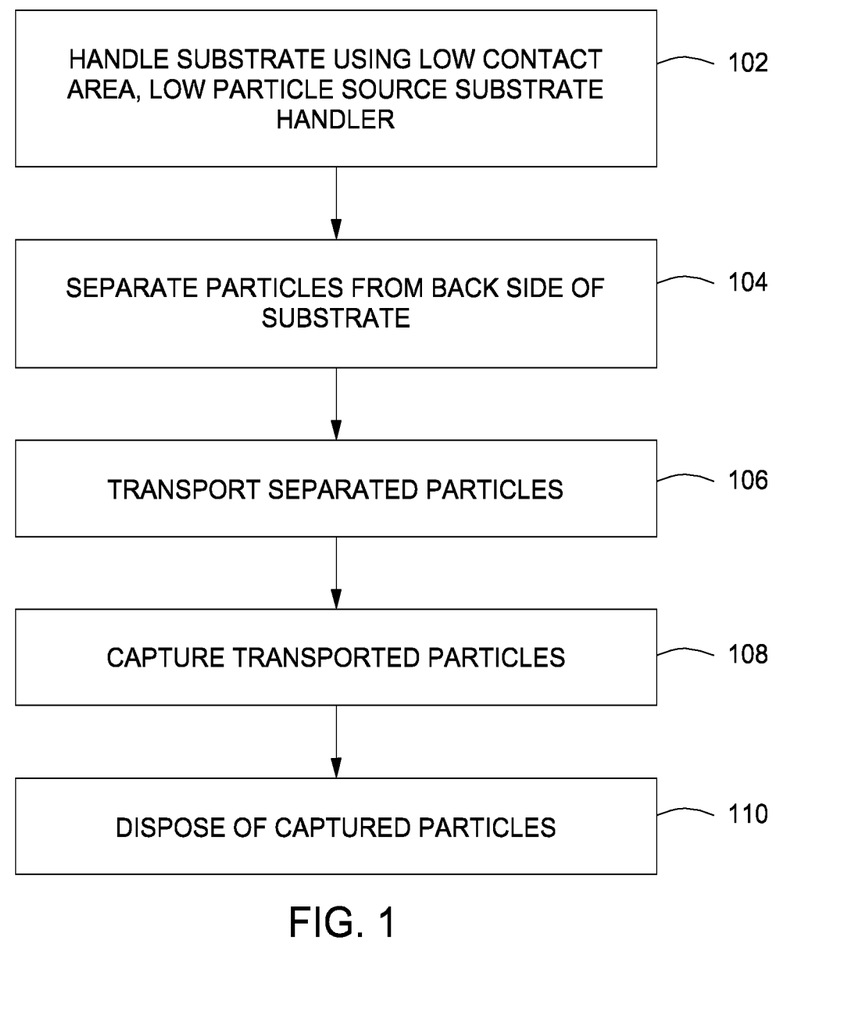
FIG. 1 is a is a flow diagram showing an example of a method of removing particles from a surface of a substrate in accordance with some embodiments of the present disclosure.

FIG. 1 is a flow diagram showing an overview of a method of removing particles from a surface of a substrate in accordance with embodiments of the present disclosure. The method generally begins at 102, where the substrate is first handled by a substrate handler that has no direct contact or minimal contact with the substrate. In some embodiments, the substrate handler may be arranged as an end effector of a robotic arm.

Figure 2A:
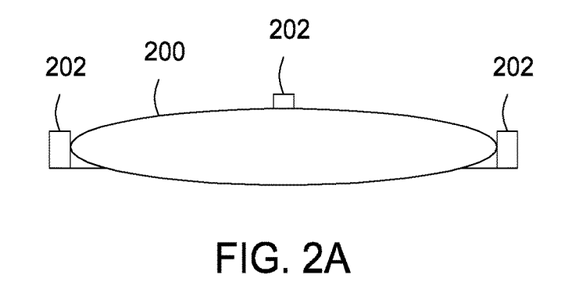
FIGS. 2A-2D are diagrams showing examples of substrate handling in accordance with some embodiments of the present disclosure.

In some embodiments, the substrate handler may provide minimal contact with the substrate by contacting the edge of the substrate. FIG. 2A shows an example of a substrate handler in which the substrate 200 is held using contact ledges at locations on the edge of the substrate. Although three contact ledges 202 are depicted in FIG. 2A, fewer or greater numbers of contact ledges may be used to support the substrate.

Figure 2B:
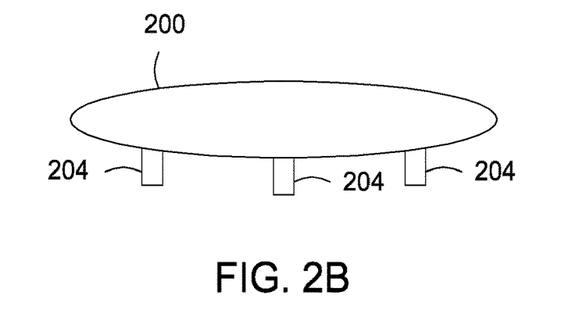

In some embodiments, the substrate handler may provide minimal contact with the substrate when contacting a surface of the substrate. FIG. 2B shows an example wherein the substrate 200 is handled using lift pins, such as the three lift pins 204. In some embodiments, the lift pins may include vacuum channels to facilitate securing the substrate to the ends of the lift pins. Although three lift pins 204 are depicted in FIG. 2B, other numbers of lift pins may be used as long as the substrate may be safely supported and secured by the lift pins. However, greater numbers of lift pins will typically undesirably increase the contact surface area between the substrate and the lift pins.

Figure 2C:
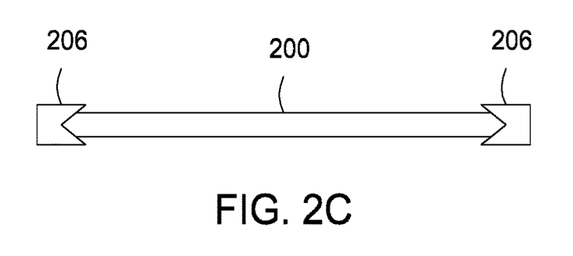

In some embodiments, minimal contact with the substrate may be provided by a substrate handler that grips the substrate by its edges. FIG. 2C shows an example of a substrate handler in which the substrate 200 is held by edge grippers 206. The edge grippers may also self-center the substrate.

Figure 2D:
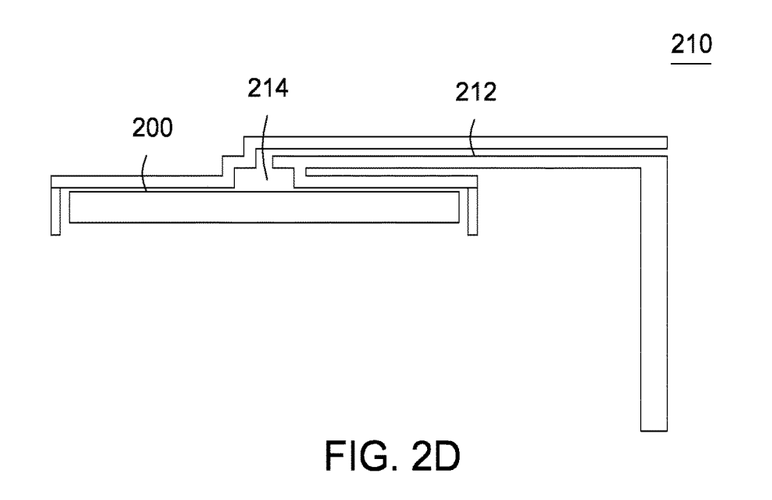

In some embodiments, the substrate handler may hold the substrate without contact with the substrate, such as by holding the substrate with a vacuum force generated by a high speed flow vortex. FIG. 2D shows an example in which the substrate handler may be a vortex gripper 210. Air may be delivered via a channel 212 to a region 214 where the vortex is generated and holds the substrate 200.

Figure 3A:
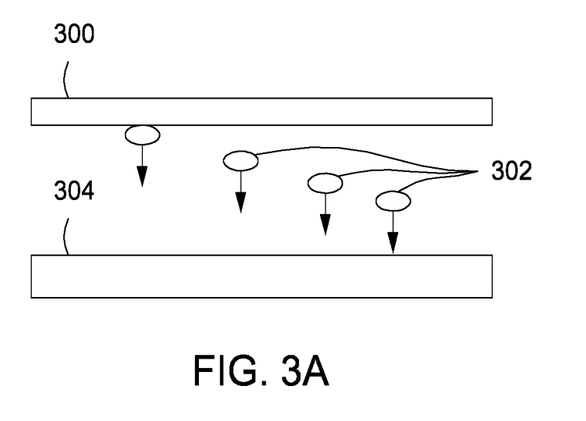
FIGS. 3A-3B are diagrams showing examples of particle separation and transport in accordance with some embodiments of the present disclosure.

Referring back to FIG. 1, at 104, particles are separated from the surface of the substrate by a particle separator. In some embodiments, the particle separator may remove the particles using electrostatic attraction. FIG. 3A shows an example of a particle separator in which the particles 302 may be attracted away from a substrate 300 by electrostatic induction caused by locating an electrostatically charged (ESC) device 304 in proximity to the substrate 300. The ESC device 304 redistributes electrical charge in the particles 302 and thus draws the particles 302 toward a surface of the ESC device 304.

Figure 3B:
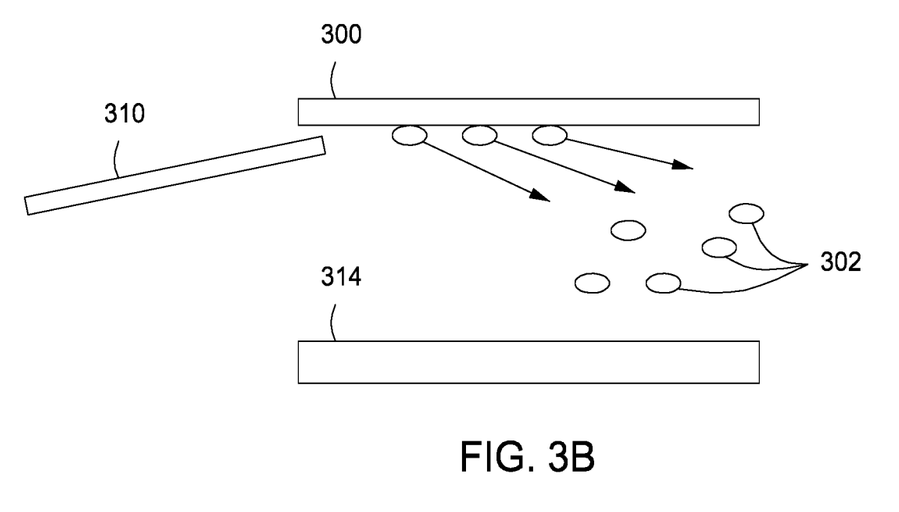

In some embodiments, the particles may be separated by an ionized gas flow. FIG. 3B shows an example of a particle separator in which an ionized gas may be delivered at high velocity to the surface of the substrate via a gas jet 310. The high velocity ionized gas may push the particles 302 off the surface of the substrate 300. The ionized gas may also charge the particles 302 so that they may be repulsed away from the substrate 300 by an electric curtain 314. The electric curtain 314 may be a series of parallel electrodes embedded in a dielectric material and coated by a thin dielectric film. The parallel electrodes may be driven by a high-amplitude oscillating electrostatic potential with a prescribed phase difference between neighboring electrodes and may create a traveling electrostatic wave that travels up the electric curtain and drives the electrically charged particles. For example, the parallel electrodes may be driven using three-phase AC excitation.

Referring again to FIG. 1, at 106, the separated particles are transported away from the substrate by a particle transporter. In some embodiments, the particle separator further serves as the particle transporter. For example, the particles separated from the surface of the substrate using electrostatic attraction may also be transported using electrostatic attraction. In the example shown in FIG. 3A, the particles 302 separated from the substrate 300 by electrostatic attraction from the ESC device 304 may then be drawn nearer to the ESC device 304 by the same attraction from the ESC device 304.

In some embodiments, the particles separated from the surface of the substrate then transported using a gas flow. In the example shown in FIG. 3B, after the electrically charged particles 302 are separated from the surface of the substrate by the ionized gas and the electric curtain 314, the gas jet 310 may now deliver a neutral gas that directs the particles away from the electric curtain 314.

Figure 4A:
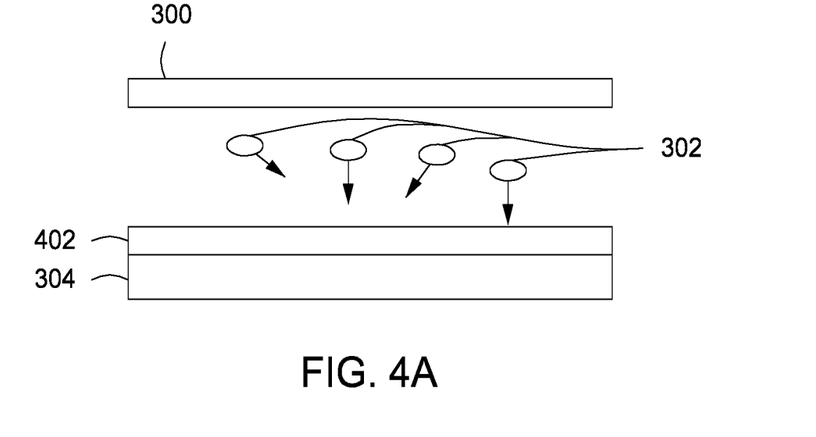
FIGS. 4A-4B are diagrams showing examples of particle collection and capture in accordance with some embodiments of the present disclosure.

Turning again to FIG. 1, at 108, the transported particles are captured by a particle collector. In some embodiments, the particles may be captured by an adhesive surface, such as one that causes the particles to adhere to it by van der Waals attraction. FIG. 4A shows an example in which a adhesive/silicone layer 402 may be provided, for example, atop an ESC device, such as the ESC device 304 shown in FIG. 3A. The particles 302 pulled by electrostatic attraction to the ESC device may then be captured by the adhesive/silicone layer 402.

Figure 4B:
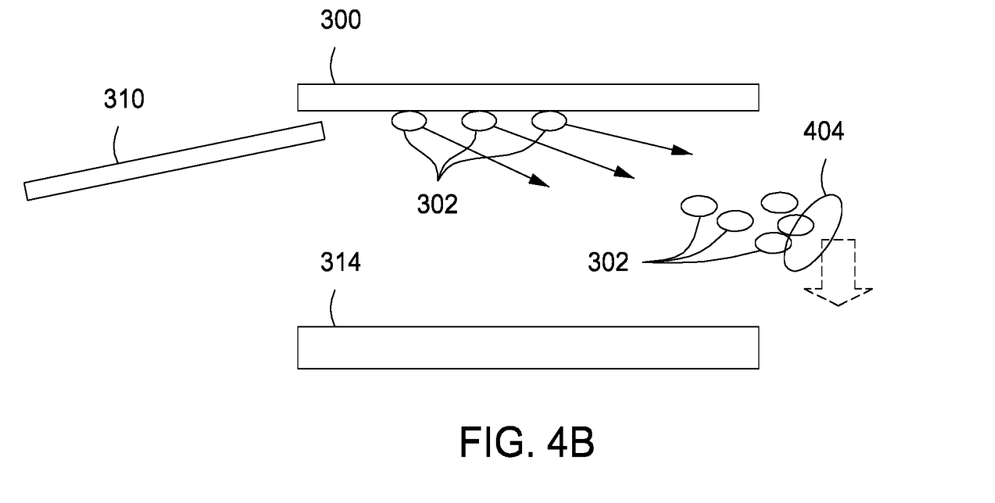

In some embodiments, the particles may be captured by a vacuum device. FIG. 4B shows an example in which the particles that are directed away from the electric curtain 314 by the neutral gas are then collected and captured by a vacuum probe 404 connected to a vacuum pump.

Referring back to FIG. 1, at 108, the captured particles are disposed of. In some embodiments, the captured particles may be disposed of intermittently as described herein with reference to FIGS. 5A-5D. In some embodiments, the captured particles may be disposed of continuously after being captured as described herein with reference to FIGS. 6A-6D.

FIGS. 5A-5D show an example of a system for removing particles from a surface of a substrate. The system may include examples of a substrate handler, a particle separator, a particle transporter, and a particle collector as described herein.

Figure 5A:
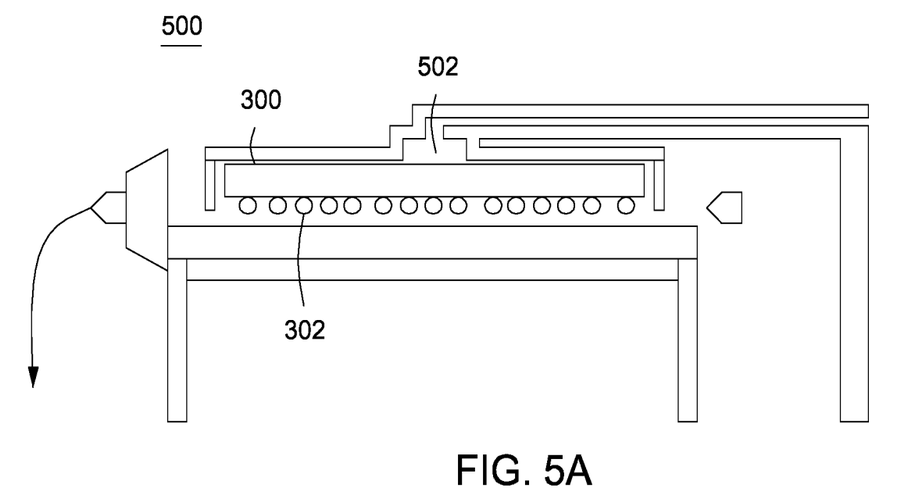
FIGS. 5A-5D are diagrams showing an example of a system for removing particles from a surface of a substrate in accordance with some embodiments of the present disclosure.

FIG. 5A shows the substrate 300 having a surface upon which the particles 302 are disposed. The substrate 300 may be held at another surface by a vortex gripper 502, which may be the vortex gripper 201 shown in FIG. 2D, which serves as substrate handler that may hold the substrate without contact thereto.

Figure 5B:
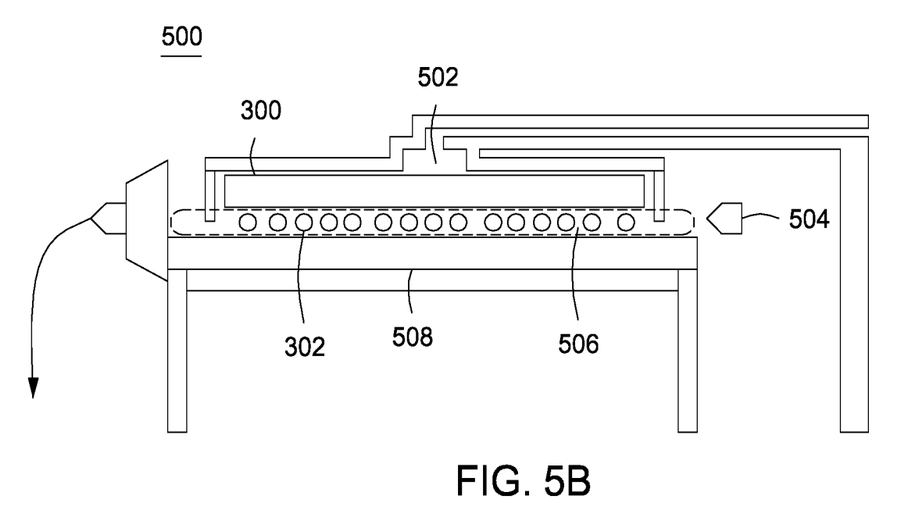

FIG. 5B shows an example of a particle separator by which the particles 302 may be drawn away from the surface of the substrate 300. While the substrate 300 is held by the vortex gripper 502, the particles 302 may be electrically charged by an ionized gas delivered by a gas jet nozzle 504, such as using ionized nitrogen gas. The particles 302 may then be separated from the surface of the substrate by an electric curtain 506 generated by, for example, three-phase excitation of a device 508, such as using the particle separator shown in FIG. 3B.

Figure 5C:
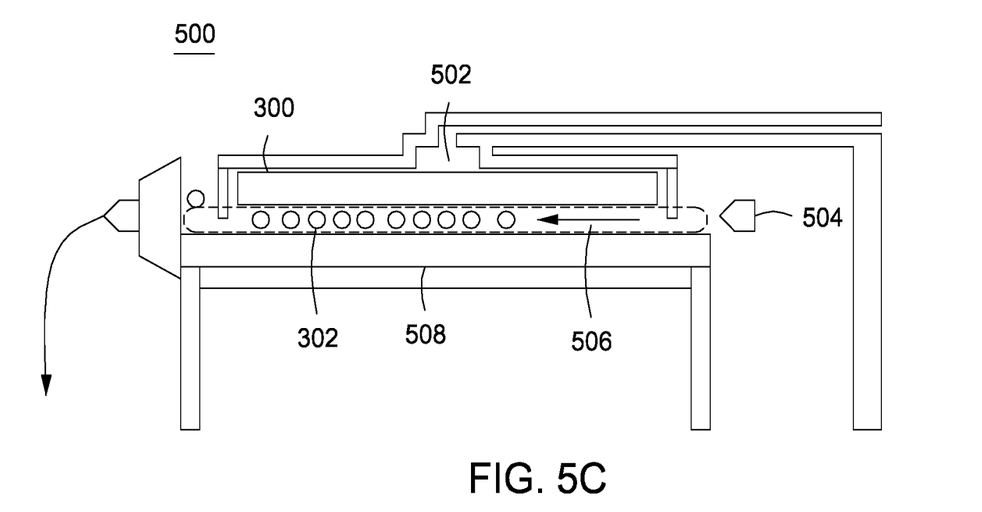

FIG. 5C shows that while the substrate 300 may still be held by the vortex gripper 502, a particle transporter may transport the separated particles 302 further way from the surface of the substrate 300. For example, the gas jet nozzle 504 may now deliver a neutral gas that directs the particles 302 away from the electric curtain 506 in the direction of the gas flow.

Figure 5D:
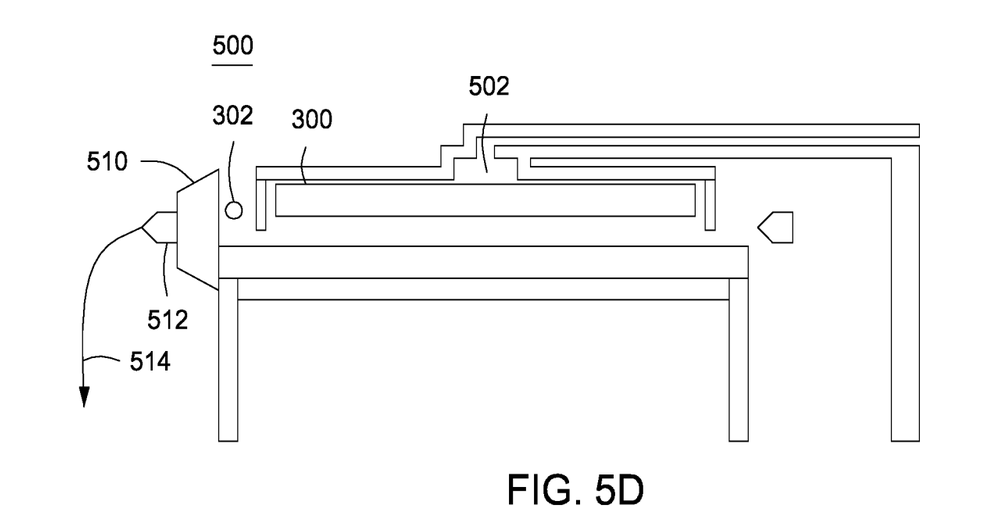

FIG. 5D shows that while the vortex gripper 502 may continue to hold the substrate 300, a particle collector may capture the particles 302. The particles 302 may be driven by the gas flow shown in FIG. 5C into an electrically charged electrostatic funnel 510 which attracts the particles 302. The electrostatic funnel 510 may be cleaned intermittently to dispose of the particles 302 captured by the electrostatic funnel 510. A vacuum nozzle 512 may also be provided to capture the particles 302 not trapped by the electrostatic funnel 510 and may draw these particles 302 into a vacuum system 514 which disposes of the particles 302.

FIGS. 6A-6D show another example of a system for removing particles from a surface of a substrate. This system may likewise include examples of a substrate handler, a particle separator, a particle transporter, and a particle collector as described herein.

Figure 6A:
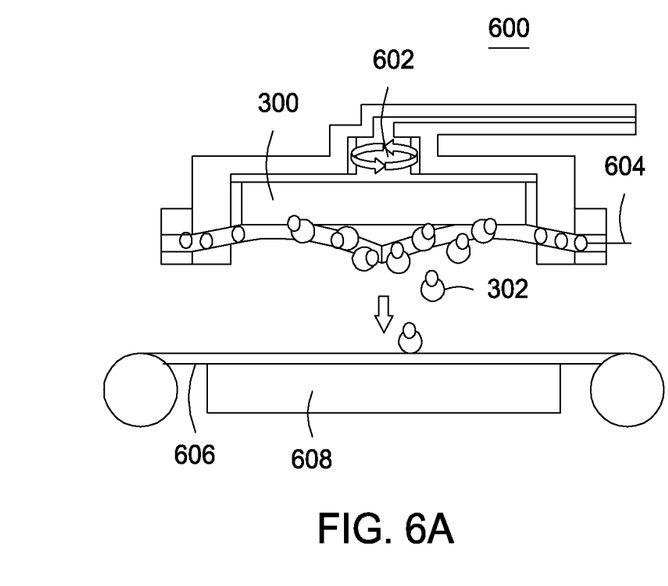
FIGS. 6A-6D are diagrams showing another example of a system for removing particles from a surface of a substrate in accordance with some embodiments of the present disclosure.

FIG. 6A shows a vortex gripper 602, which may be the vortex gripper 201 shown in FIG. 2D, which may serve as a substrate handler. The vortex gripper 602 may hold a surface of the substrate 300 opposite the surface the one on which the particles 302 are disposed. An ionized gas, such as ionized nitrogen gas, may be injected through an injection nozzle 604 which may be integral with the vortex gripper 602. The ionized gas may direct some of the particles 302 away from the surface of the substrate 300, for example, toward an adhesive film 606 which may be disposed atop a presently grounded ESC device 608.

Figure 6B:
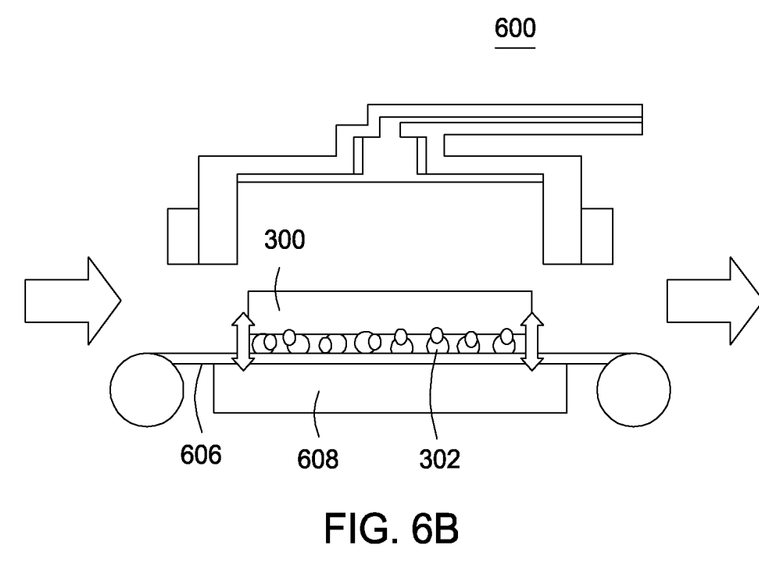

As FIG. 6B shows, the substrate 300 may be released by the vortex gripper 602, and an electrical potential, such as a 5 kV potential, may be supplied to the ESC device 608 which clamps the substrate 300 to the adhesive film 606. The clamping of the substrate 300 to the adhesive film 606 may push onto the adhesive film 606 the particles 302 that were not separated by the ionized gas. The injection nozzle 604, the adhesive film 606, and ESC device 608 combine to serve as a particle separator.

Figure 6C:
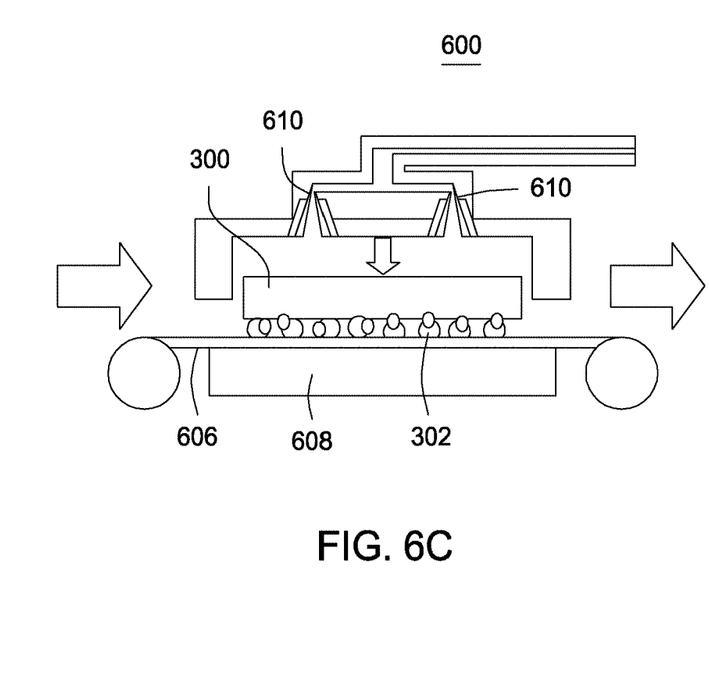

Referring now to FIG. 6C, a gas may be delivered by spray nozzles 610, which may be integral with the vortex gripper 602, and may further push the substrate 300 onto the adhesive film 606 to further strengthen the clamping provided by the ESC device 608. The stronger clamping may more firmly push the particles 302 against the adhesive film 606. The injection nozzle 604, the adhesive film 606, the ESC device 608 and the spray nozzles 610 combine to serve as a particle separator.

Figure 6D:
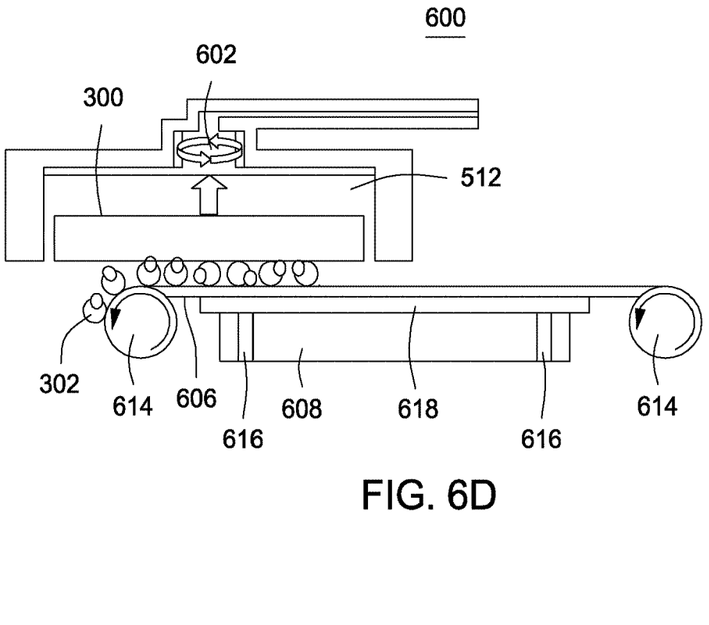

FIG. 6D shows that, next, the gas is no longer delivered by the spray nozzles 610 and the electrical potential is removed from the ESC device 608. The vortex gripper 602 may now again pick up the substrate 300 away from the adhesive film 606, and the particles 302 may be left on the adhesive film 606. The adhesive film 606 may be a continuous film wound on a pair of rollers 614. After the substrate 300 is picked up by the vortex gripper 602, the pair of rollers 614 may rotate to advance the portion of the adhesive film 606 upon which the particles 302 are adhered onto one of the rollers 614 and thus dispose of the particles 302. A gas layer may be provided by channels 616 to the underlying surface of the adhesive film 606 while the rollers 614 rotate and thus separate the adhesive film 606 from the ESC device 608. Thus, the adhesive film 606 further serves as a particle transporter and a particle collector.

As depicted in FIG. 6D, in some embodiments, in the event the vortex gripper has insufficient power to lift off the wafer due to residual electrostatic charge, the substrate may be conveyed toward the edge of the roller sheet under the lubrication of the backside gas layer, such that a peeling effect is achieved at the roller ends. The rigid substrate will be displaced laterally, while the flexible film will be rolled up. The substrate gripper can then be placed at an appropriate position to laterally support and subsequently take over the handling once the film has been peeled off sufficiently.

Figure 7A:
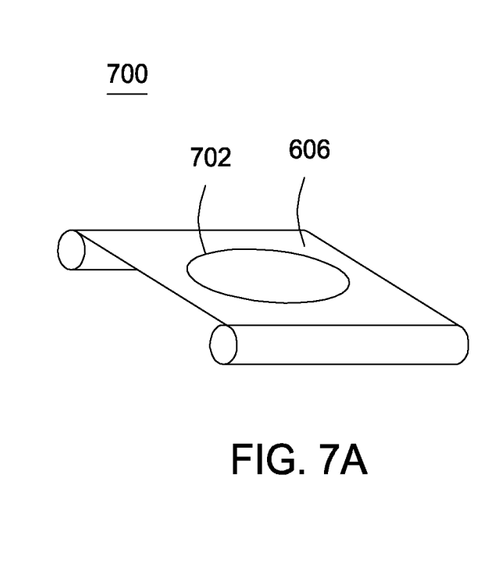
FIGS. 7A-7C are diagrams showing examples of electrostatic clamps in accordance with some embodiments of the present disclosure.
Figure 7B:
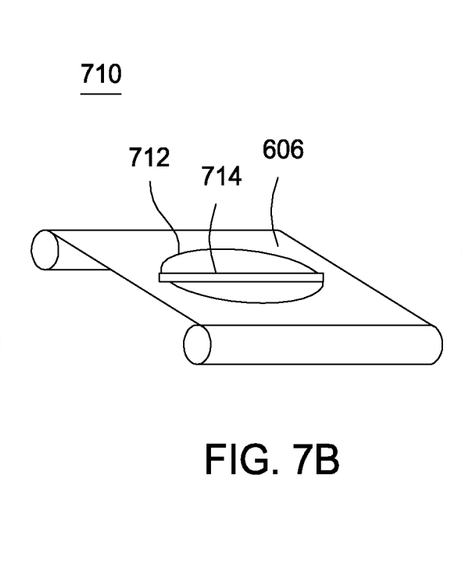
Figure 7C:
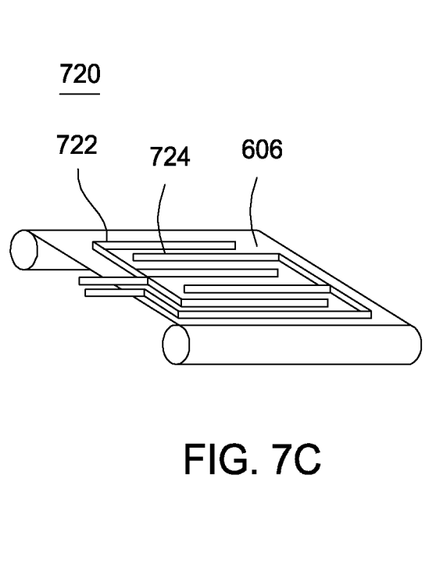

FIGS. 7A-7C show examples of configurations of ESC devices which may serve as the ESC device 608 depicted in FIGS. 6A-6D. FIG. 7A shows an example of a monopolar ESC device 700 in which a single potential may be delivered to a monopole 740. When the monopolar ESC device 700 is used as the ESC device 608 of FIGS. 6A-6D, and a positive potential is applied, the substrate is clamped to the ESC, and the particles 302 are captured by the adhesive film 606 disposed atop the monopolar ESC device 700.

FIG. 7B shows an example of a bipolar ESC device 710 in which a positive potential may be delivered to one pole 712 of the bipolar ESC device 710 and a negative potential may be delivered to another pole 714 of the bipolar ESC device 710. The oppositely charged poles 712 and 714 of the bipolar ESC device 710 may induce opposite charges in different regions of the substrate and thus may increase the strength of the clamping of the substrate to the bipolar ESC device 710.

FIG. 7C shows another example of a bipolar ESC device 720 in which the two electrodes may be interdigitated and embedded in the adhesive film 606. A positive potential may be delivered to one electrode 722 of the bipolar ESC device 720 and a negative potential may be delivered to another electrode 724 of the bipolar ESC device 720. As with the bipolar ESC device 710, the bipolar ESC device 720 may provide the stronger clamping of the substrate to the bipolar ESC device 720. The interdigitated electrodes 722, 724 may be formed, for example, as a metallization on top of the adhesive film 606.

Although exemplary combinations of elements have been described together in the various embodiments disclosed above, different elements of these embodiments may be arranged in other combinations in accordance with the teachings disclosed herein. For example, one or more of the above-disclosed elements, or variations or substitutions thereof, may be used to provide methods and apparatus for removing particles from a surface of a substrate in accordance with the present disclosure. Thus, while the foregoing is directed to embodiments of the present disclosure, other and further embodiments of the disclosure may be devised without departing from the basic scope thereof.

The invention claimed is:

1. Apparatus for removing particles from a lowest surface of a substrate, comprising:

at least one of a vortex gripper, edge contacts, lift pins, or an edge grip to expose the lowest surface of the substrate;

at least one of an ionized gas source located near an edge of the lowest surface of the substrate or an electrostatic induction device that faces the lowest surface of the substrate to exert a force directly on the lowest surface of the substrate to separate particles from the lowest surface of the substrate;

at least one of a non-ionized gas source located near the edge of the lowest surface of the substrate, a non-ionized gas source facing an opposing surface of the substrate, or a roller fed adhesive film disposed atop a surface of an electrostatic induction device that faces the lowest surface of the substrate, separate from the substrate, to exert a force directly on the separated particles to transport the separated particles away from the lowest surface of the substrate; and at least one of an electrostatic funnel disposed near an opposing edge of the lowest surface of the substrate or a vacuum source disposed near the opposing edge of the lowest surface of the substrate, separate from the substrate, to collect the transported particles.

2. The apparatus of claim 1, wherein the ionized gas source includes at least one of a gas jet or an injection nozzle.

3. The apparatus of claim 1, wherein the electrostatic induction device includes at least one of a monopolar electrostatically charged (ESC) device, a bipolar ESC device, or interdigitated electrodes.

4. The apparatus of claim 1, wherein the non-ionized gas source is arranged to deliver non-ionized gas along the surface of the substrate or is arranged to deliver non-ionized gas to the opposing surface of the substrate.

5. The apparatus of claim 1, wherein the non-ionized gas source includes at least one of a gas jet or a spray nozzle.

6. The apparatus of claim 1, wherein the electrostatic induction device exerts a force directly on the separated particles to transport the separated particles away from the lowest surface of the substrate.

7. The apparatus of claim 1, wherein the vacuum source includes a vacuum nozzle.

8. The apparatus of claim 7, wherein the vacuum nozzle collects the transported particles and draws the collected particles into a vacuum system to dispose of the collected particles.

9. The apparatus of claim 1, wherein the electrostatic funnel is cleaned to dispose of the collected particles.

10. The apparatus of claim 9, wherein the electrostatic funnel is cleaned intermittently.

* * * * *

UNITED STATES PATENT AND TRADEMARK OFFICE
CERTIFICATE OF CORRECTION

PATENT NO. : 10,549,324 B2
APPLICATION NO. : 15/974000
DATED : February 4, 2020
INVENTOR(S) : Sriskantharajah Thirunavukarasu et al.

Page 1 of 1

It is certified that error appears in the above-identified patent and that said Letters Patent is hereby corrected as shown below:

In the Specification

Column 1, Line 8, delete:
"issued as U.S. Pat. No. 9,993,853 on which"
And replace with:
"issued as U.S. Pat. No. 9,993,853 on June 12, 2018 which"

Signed and Sealed this
Twenty-fourth Day of March, 2020

Andrei Iancu
*Director of the United States Patent and Trademark Office*